United States Patent
Jeong et al.

(10) Patent No.: US 7,979,605 B2
(45) Date of Patent: Jul. 12, 2011

(54) LATENCY CONTROL CIRCUIT AND METHOD USING QUEUING DESIGN METHOD

(75) Inventors: Byung-Hoon Jeong, Gyeonggi-do (KR); Hoe-Ju Chung, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1071 days.

(21) Appl. No.: 11/742,336

(22) Filed: Apr. 30, 2007

(65) Prior Publication Data

US 2008/0043547 A1 Feb. 21, 2008

(30) Foreign Application Priority Data

Aug. 16, 2006 (KR) ........................ 10-2006-0077121

(51) Int. Cl.
*G06F 3/00* (2006.01)
(52) U.S. Cl. ........................ 710/52; 365/194
(58) Field of Classification Search .................. None
See application file for complete search history.

(56) References Cited

U.S. PATENT DOCUMENTS

| | | | |
|---|---|---|---|
| 6,262,938 B1 * | 7/2001 | Lee et al. | 365/233.12 |
| 2005/0138255 A1 * | 6/2005 | Moyer et al. | 710/260 |
| 2005/0160245 A1 | 7/2005 | Artieri | |
| 2007/0085587 A1 * | 4/2007 | Lee | 327/291 |

FOREIGN PATENT DOCUMENTS

| | | |
|---|---|---|
| JP | 03-091188 | 6/1991 |
| JP | 2002-150763 | 5/2002 |

OTHER PUBLICATIONS

IBM, Speculative Latency Measurement Method and Apparatus, Oct. 10, 2002, IBM, pp. 1-4.*
English language abstract of Japanese Publication No. 03-091188.
English language abstract of Japanese Publication No. 2002-150763.

* cited by examiner

*Primary Examiner* — Eron J Sorrell
(74) *Attorney, Agent, or Firm* — Muir Patent Consulting, PLLC

(57) ABSTRACT

A latency control circuit includes a FIFO controller and a register unit. The FIFO controller may generate an increase signal according to an external command, and generate a decrease signal according to an internal command. The FIFO controller may also enable a depth point signal responsive to the increase signal and the decrease signal. The register unit may include n registers. The value n (rounded off) may be obtained by dividing a larger value of a maximum number of additive latencies and a maximum number of write latencies by a column cycle delay time (tCCD). The registers may store an address received with the external command responsive to the increase signal and a clock signal, and may shift either the address or a previous address to a neighboring register. The latency control circuit transmits an address stored in a register as a column address corresponding to the enabled depth point signal.

21 Claims, 5 Drawing Sheets

LATENCY CONTROL CIRCUIT AND METHOD USING QUEUING DESIGN METHOD

CROSS-REFERENCE TO RELATED PATENT APPLICATION

This application claims the benefit of Korean Patent Application No. 10-2006-0077121, filed on Aug. 16, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a latency control circuit and method using a queuing design method.

2. Description of the Related Art

As the operating frequency of a DDR DRAM increases higher than 800 MHz, the input latency of the DDR DRAM also increases. The input latency includes an additive latency and a write latency. The additive latency represents the number of delayed clock cycles between an external read command, an external write command, or an external address signal and an internal read command signal, an internal write command signal, or an internal address signal, respectively. The additive latency may be set to, for example, three through ten (AL3 through AL10). The write latency represents the number of delayed clock cycles between an address signal input with a write command or write data and an internal address signal or internal write data generated from the address signal or the write data. The write latency may be set to five through eight (WL5 through WL8).

FIG. 1 illustrates a conventional latency control circuit 100. Referring to FIG. 1, the latency control circuit 100 includes first through eighth registers 101 through 108. The first through eighth registers 101 through 108 sequentially shift a received address or command ADDR/CMD in response to a clock signal CLK. An additive latency control signal is generated according to a set additive latency AL. For example, the output of the third register 103 is generated as the additive latency control signal when the additive latency is three (AL3), the output of the fourth register 104 is generated as the additive latency control signal when the additive latency is four (AL4), and the output of the seventh register 107 is generated as the additive latency control signal when the additive latency is seven (AL7). An internal read command signal, an internal write command signal, or an internal address signal is generated according to the additive latency control signal.

The latency control circuit 100 is required for each address ADDR and each command CMD. If the number of additive latencies is ten, the number of write latencies is eight, the total number of addresses including a column address and a bank address is fifteen, and the number of commands /CS, /RAS, /CAS and /WE is four, the total number of registers required for the latency control circuit 100 corresponds to (15+4)*10+15*8=310. As the number of registers increases, the area occupied by the registers increases and routing becomes complicated.

FIG. 2 illustrates another conventional latency control circuit 200. Referring to FIG. 2, the latency control circuit 200 includes first through seventh registers 201 through 207 that sequentially shift a write command WRT in response to an internal clock signal PCLK. The latency control circuit 200 further includes eighth and ninth registers 208 and 209 that shift an address ADDR in response to the write command WRT and the output of the third register 203, respectively. The eighth register 208 latches the address in response to the write command WRT. The ninth register 209 latches the output of the eighth register 208 in response to the output of the third register 203. The eighth register 208 generates a first address signal CAi+1 in response to one of first, second, third, and fourth write latencies WL1/2/3/4. The ninth register 209 generates a second address signal CAi in response to one of fifth, sixth, and seventh write latencies WL5/6/7.

With respect to the operation of a DDR DRAM, a column cycle delay time tCCD represents the number of delayed clock cycles between a write command and a write command. The column cycle delay time tCCD is defined by the number of clock cycles corresponding to half a burst length (BL), that is, BL/2. When the burst length is eight, tCCD corresponds to four clock cycles. To satisfy the tCCD, the latency control circuit 200 requires the eighth and ninth registers 208 and 209. The eighth register 208 stores an address ADDR corresponding to a first write command WRT and generates the first address signal CAi+1 in response to one of the first, second, third, and fourth write latencies WL1/2/3/4. The ninth register 209 stores the address ADDR stored in the eighth register 208 in response to the output of the third register 203 when an address ADDR corresponding to a second write command WRT is input. At this time, the address ADDR corresponding to the second write command WRT is stored in the eighth register 208. The ninth register 209 generates the second address signal CAi in response to one of the fifth, sixth, and seventh write latencies WL5/6/7.

In the latency control circuit 200, however, the address stored in the eighth register 208 is shifted to the ninth register 209 according to the output of the third register 203 even though the second write command is not input to the latency control circuit 200. Accordingly, the latency control circuit 200 has a surplus operation.

SUMMARY OF THE INVENTION

Example embodiments of the present invention provide a latency control circuit using a queuing design method, which reduces the number of registers used to control input latency of a memory chip. As a result, layout area and power consumption are decreased.

Example embodiments of the present invention also provide a latency control method using the latency control circuit.

One example embodiment of the present invention includes a FIFO controller configured to generate an increase signal according to an external command, to generate a decrease signal according to an internal command, and to enable at least one depth point signal responsive to the increase signal and the decrease signal, and a register unit configured to store an address in a first register responsive to a clock signal, to shift a previous address to a second register, and to transmit one of the address and the previous address as a column address responsive to the enabled depth point signal.

Another example embodiment of the present invention includes register unit comprises n registers, n multiplexers configured to select one of an address and a previous address, to store the selected address in a first of n registers, and to shift the address stored in the first register to a neighboring register, and an address selection multiplexer configured to select one of the address stored in the first register and the address stored in the neighboring register.

Yet another example embodiment of the present invention includes a latency control method comprising receiving an external command and an address responsive to a clock signal, generating a first signal responsive to the external command, storing the address in a register responsive to the first signal, shifting the address to a neighboring register, generating a second signal responsive to an internal command generated from the external command, and selecting at least one of a plurality of depth point signals to designate one of the register and the neighboring register.

According to example embodiments of the latency control circuit of the present invention, a surplus register shift operation, which occurs even when a second command is not input after the first command in the conventional latency control circuit, does not occur in embodiments of the present invention. The effective address latch margin of the column address signal generated in the latency control circuit is increased. Furthermore, the area occupied by the registers and power consumption can be reduced because the number of the registers is determined on the basis of a value n (rounded off), obtained by dividing a larger value of a maximum number of additive latencies and a maximum number of write latencies by a column cycle delay time (tCCD).

BRIEF DESCRIPTION OF THE DRAWINGS

The foregoing and other features, objects, and advantages of the various example embodiments of the invention will become more readily apparent from the following detailed description, which proceeds with reference to the accompanying drawings.

DETAILED DESCRIPTION OF THE INVENTION

Figure 1:
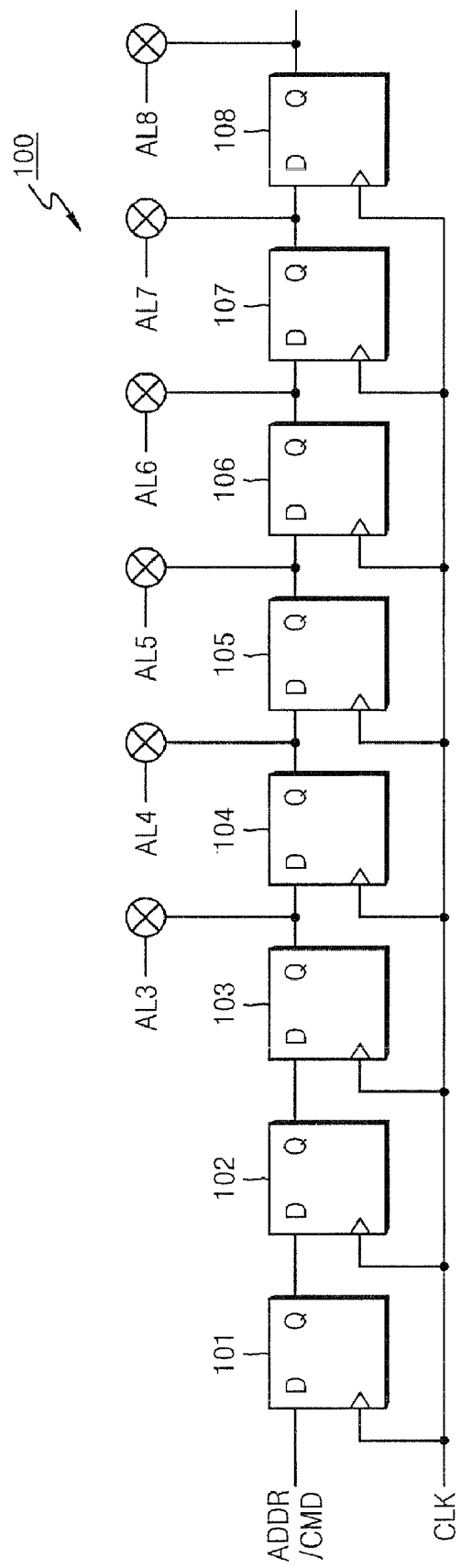
FIG. 1 illustrates a conventional latency control circuit.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 3:
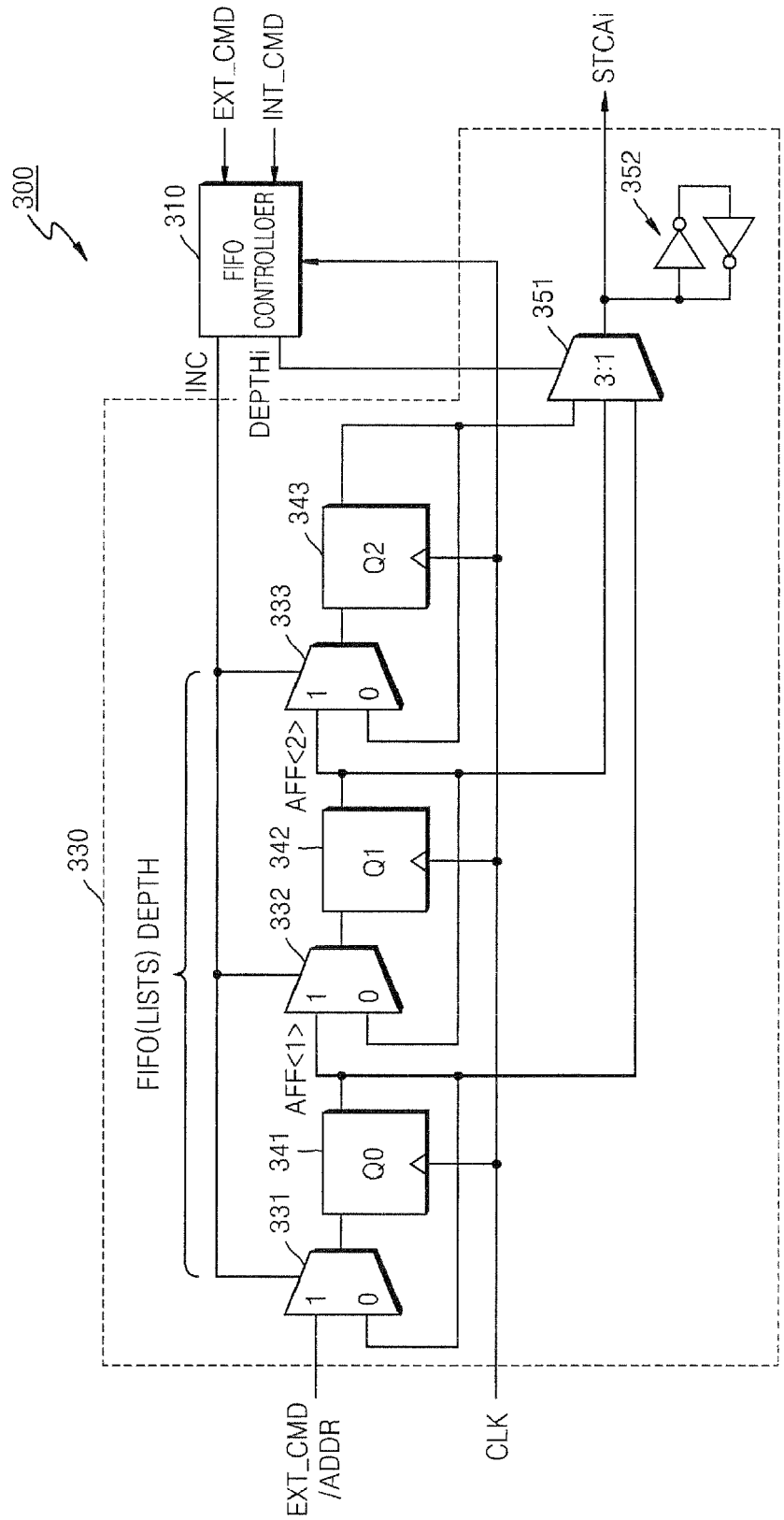
FIG. 3 illustrates a latency control circuit according to an embodiment of the present invention.

FIG. 3 illustrates a latency control circuit 300 according to an embodiment of the present invention. In this embodiment, the latency control circuit 300 may control the latency of one command (e.g., a read command) and the latency of one address. Thus, a semiconductor memory device may include a plurality of latency control circuits 300—as many as the number of addresses and the number of commands.

Referring to FIG. 3, the latency control circuit 300 may include a FIFO controller 310 and a register unit 330. The operation of the latency control circuit 300 will be explained under such conditions when the number of additive latencies AL is ten, the number of write latencies WL is eight, and the burst length BL is eight. Accordingly, the number of registers included in the latency control circuit 300 may be determined as (ALmax or WLmax)/tCCT. (ALmax represents a maximum number of additive latencies and WLmax represents a maximum number of write latencies.) That is, the total number of registers, under this example condition, may be determined as three because 10/4=2.5, which is rounded to three. The register unit 330 may include three registers 341, 342, and 343. A person having ordinary skill in the art will recognize that the number of registers constructing the latency control circuit 300 may vary responsive to the number of additive latencies AL or the number of write latencies WL.

The FIFO controller 310 may receive an external command EXT_CMD and an internal command INT_CMD responsive to a clock signal CLK. The FIFO controller 310 may generate an increase signal INC when receiving the external command EXT_CMD and may generate a decrease signal DEC when receiving the internal command INT_CMD. The FIFO controller 310 may generate a depth point signal DEPTHi (i=0 through n) according to the increase signal INC and the decrease signal DEC. The depth point signal DEPTHi may designate the position of a register, which stores an address ADDR received with the external command EXT_CMD, in the register unit 330. For example, one depth point signal DEPTH1 may designate the first register 341, another depth point signal DEPTH2 may designate the second register 342, and yet another depth point signal DEPTH3 may designate the third register 343. The FIFO controller 310 will be explained in more detail later with reference to FIG. 4.

The register unit 330 may sequentially store the external command EXT_CMD or the address ADDR in the registers 341, 342, and 343 responsive to the increase signal INC and may generate a column address signal STCAi responsive to the depth point signal DEPTHi. The register unit 330 may include first, second, third, and fourth multiplexers 331, 332, 333 and 351, respectively. The register unit 330 may also include the first, second, and third registers 341, 342 and 343, and a latch 352.

Each of the first, second, and third multiplexers 331, 332, and 333 may transmit one of signals input to a "1" input terminal and a "0" input terminal responsive to the increase signal INC. The first multiplexer 331 may receive the external command EXT_CMD or the address ADDR through the "1" input terminal and may receive the output of the first register 341 through the "0" input terminal. The second multiplexer 332 may receive the output of the first register 341 through the "1" input terminal and may receive the output of the second register 342 through the "0" input terminal. The third multiplexer 333 may receive the output of the second register 342 through the "1" input terminal and may receive the output of the third register 343 through the "0" input terminal.

The first register 341 may store and transmit the output of the first multiplexer 331 responsive to the clock signal CLK. The second register 342 may store and transmit the output of the second multiplexer 332 responsive to the clock signal CLK. The third register 343 may store and transmit the output of the third multiplexer 333 responsive to the clock signal CLK.

The fourth multiplexer 351 may select one of the first, second, and third registers 341, 342, and 343, respectively, responsive to the depth point signal DEPTHi, and may transmit the output signal of the selected register as the column address signal STCAi. The latch 352 may latch the column address signal STCAi output from the fourth multiplexer 351.

Figure 4:
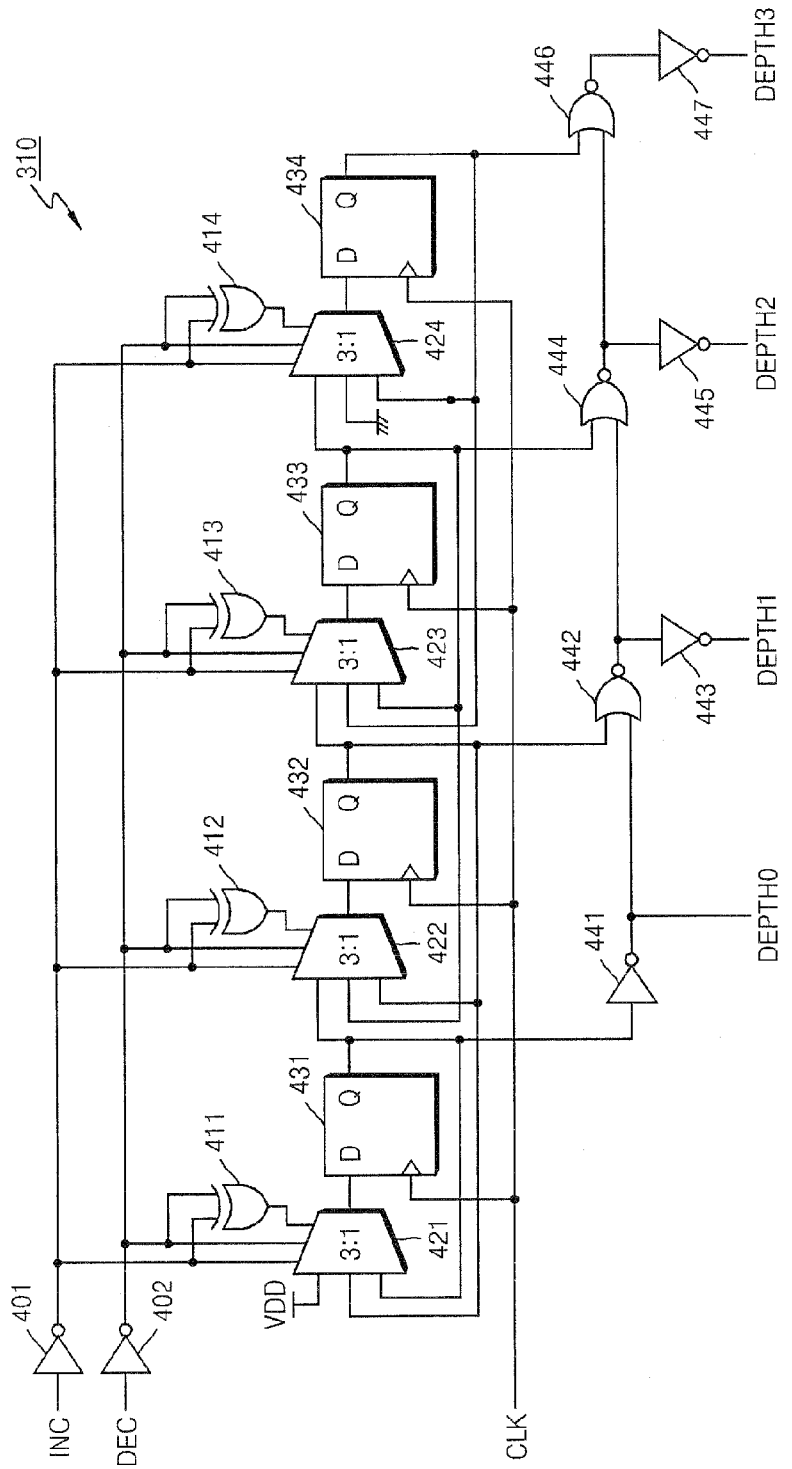
FIG. 4 shows a circuit diagram including a FIFO controller illustrated in FIG. 3.

FIG. 4 shows a circuit diagram including the FIFO controller 310 illustrated in FIG. 3. Referring to FIG. 4, the FIFO controller 310 may include a first inverter 401 to receive the increase signal INC and a second inverter 402 to receive the decrease signal DEC, the values of which may be determined responsive to the external command EXT_CMD (of FIG. 3 and FIG. 5) and the internal command INT_CMD (of FIG. 3 and FIG. 5). The outputs of the first and second inverters 401 and 402 may be input to first, second, third, and fourth exclusive OR gates 411, 412, 413, and 414. In addition, the FIFO controller 310 may include first, second, third and fourth 3:1 multiplexers 421, 422, 423 and 424 that may respectively output one of three input signals responsive to the output signal of the first inverter 401, the output signal of the second inverter 402, and the respective output signals of the exclusive OR gates 411, 412, 413, and 414. The outputs of the first, second, third, and fourth 3:1 multiplexers 421, 422, 423, and 424 may be respectively stored in flip-flops 431, 432, 433, and 434.

The first multiplexer 421 may transmit a logic signal "1" corresponding to a power voltage VDD responsive to the output signal of the first inverter 401, transmit the output signal of the second flip-flop 432 responsive to the output signal of the second inverter 402, and transmit the output signal of the first flip-flop 431 responsive to the output signal of the first exclusive OR gate 411. The second multiplexer 422 may transmit the output signal of the first flip-flip 431 responsive to the output signal of the first inverter 401, transmit the output signal of the third flip-flop 433 responsive to the output signal of the second inverter 402, and transmit the output signal of the second flip-flop 432 responsive to the output signal of the second exclusive OR gate 412. The third multiplexer 423 may transmit the output signal of the second flip-flip 432 responsive to the output signal of the first inverter 401, transmit the output signal of the fourth flip-flop 434 responsive to the output signal of the second inverter 402, and transmit the output signal of the third flip-flop 433 responsive to the output signal of the third exclusive OR gate 413. The fourth multiplexer 424 may transmit the output signal of the third flip-flip 433 responsive to the output signal of the first inverter 40 , transmit a logic signal "0" corresponding to a ground voltage VSS responsive to the output signal of the second inverter 402, and transmit the output signal of the fourth flip-flop 434 responsive to the output signal of the fourth exclusive OR gate 414. The first, second, third, and fourth multiplexers 421, 422, 423, and 424 may output corresponding input signals when the output signal of the first inverter 401, the output signal of the second inverter 402, or the output signals of the first, second, third and fourth exclusive OR gates 411, 412, 413, and 414 are "0."

The first flip-flop 431 may transmit the output signal of the first multiplexer 421 responsive to the clock signal CLK. The output signal of the first flip-flop 431 may be input to a third inverter 441, and may be transmitted as an initial depth point signal DEPTH0. The second flip-flop 432 may transmit the output signal of the second multiplexer 422 responsive to the clock signal CLK. The output signal of the second flip-flop 432 may be input to a first NOR gate 442 together with the initial depth point signal DEPTH0. The output signal of the first NOR gate 442 may be input to a fourth inverter 443, and may be transmitted as the first depth point signal DEPTH1. The third flip-flop 433 may transmit the output signal of the third multiplexer 433 responsive to the clock signal CLK. The output signal of the third flip-flop 433 is input to a second NOR gate 444 together with the output signal of the first NOR gate 442. The output signal of the second NOR gate 444 may be input to a fifth inverter 445, and may be transmitted as the second depth point signal DEPTH2. The fourth flip-flop 434 may transmit the output signal of the fourth multiplexer 424 responsive to the clock signal CLK. The output signal of the fourth flip-flop 434 may be input to a third NOR gate 446 together with the output signal of the second NOR gate 444. The output signal of the third NOR gate 446 may be input to a sixth inverter 447, and may be transmitted as the third depth point signal DEPTH3.

The first exclusive OR gate 411 may initially output a logic signal "0" responsive to the increase signal INC and the decrease signal DEC at a logic level "0." The first multiplexer 421 may transmit "0" responsive to the signal "0" transmitted from the first exclusive OR gate 411. The first flip-flop 431 may transmit "0" responsive to the clock signal CLK, and thus the initial depth point signal DEPTH0 may be set to "1." In the same manner, the second, third, and fourth flip-flops 432, 433, and 434 may transmit "0" so that the first, second and third depth point signals DEPTH1, DEPTH2, and DEPTH3 are set to "1."

Then, the increase signal INC or the decrease signal DEC may be enabled according to the external command EXT_CMD or the internal command INT_CMD. Thus, the first, second, and third depth point signals DEPTH1, DEPTH2, and DEPTH3 may be selectively enabled. This operation will be explained with reference to FIG. 5.

Figure 5:
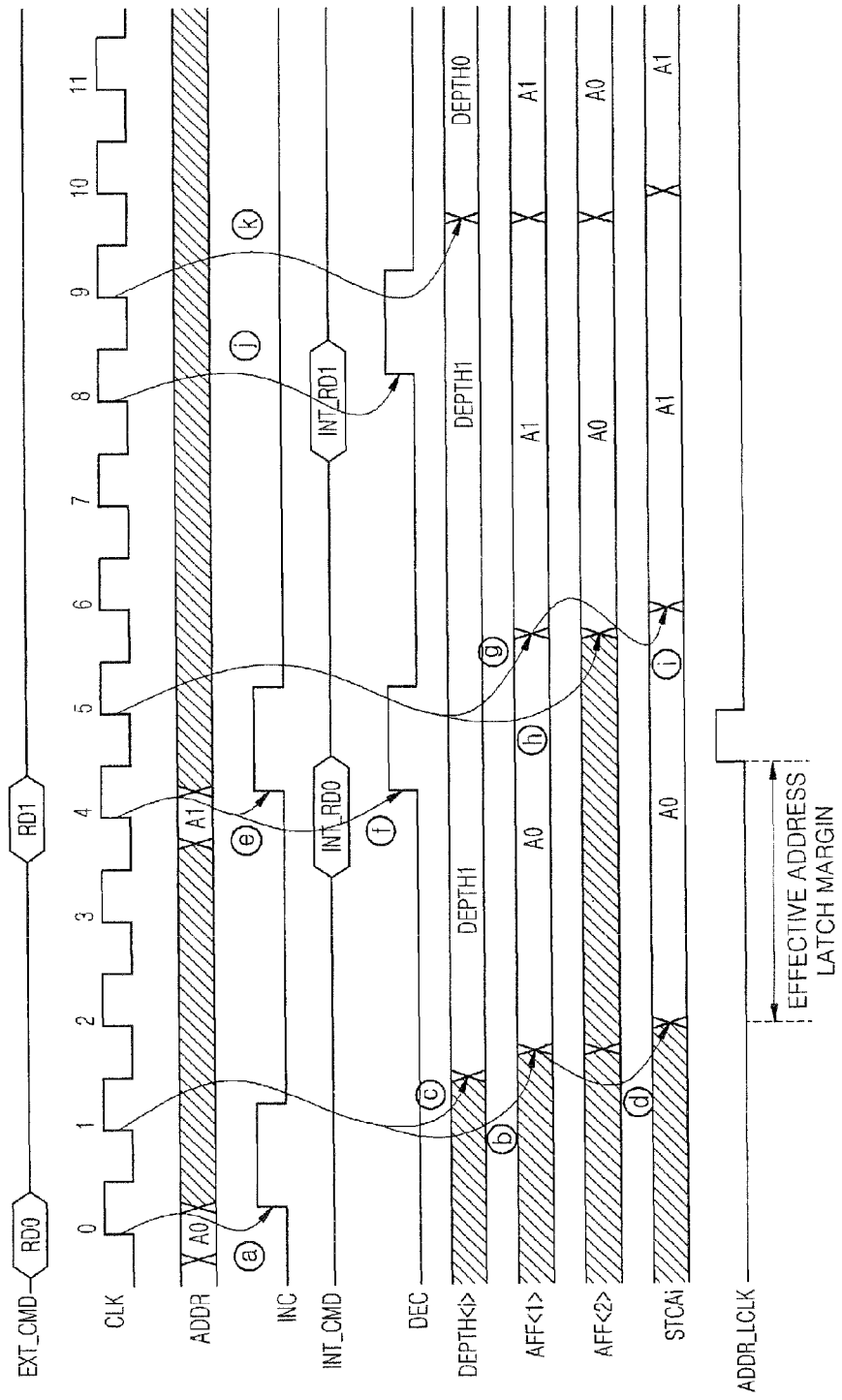
FIG. 5 shows a timing diagram including the operation of the latency control circuit illustrated in FIG. 3.

Referring to FIG. 5, tCCD may be determined as four based on the burst length of eight set in FIG. 4. A first external read command RD0 may be input at a rising edge CLK0 of the clock signal CLK, and a second external read command RD1 may be input at a rising edge CLK4. At the rising edge CLK0, a first address A0 may be input with the first external read command RD0. Accordingly, the FIFO controller 310 (of FIG. 3) may generate the increase signal INC at a logic level "1" (a). The received first address A0 may be stored in the first register 341 (of FIG. 3) at a rising edge CLK1 of the clock signal CLK while the increase signal INC is at a logic level "1" (b). At this time, the first depth point signal DEPTH1 may be enabled to a logic level "0" (c). The first address A0 stored in the first register 341 (of FIG. 3) may be output as the column address signal STCAi responsive to the enabled first depth point signal DEPTH1 (d).

At the rising edge CLK4 of the clock signal CLK, the second external read command RD1 and a second address A1 may be input. At this point, a first internal read command INT_RD0 has been generated from the first external read command RD0. Accordingly, the FIFO controller 310 (of FIG. 3) may generate the increase signal INC at a logic level "1" according to the second external read command RD1 (e), and generate the decrease signal DEC at a logic level "1" according to the first internal read command INT_RD0 (f). The second address A1 may be stored in the first register 341 (of FIG. 3) at a rising edge CLK5 of the clock signal CLK (g) while the increase signal INC is at a logic level "1," and the first address A0 stored in the first register 341 (of FIG. 3) may be shifted to the second register 342 (of FIG. 3) at step (h). The flip-flops 431, 432, 433, and 434 of the FIFO controller 310 (of FIG. 4) may maintain previous states, and thus the first depth point signal DEPTH1 may still be enabled. The second address A1 stored in the first register 341 (of FIG. 3) may be transmitted as the column address signal STCAi responsive to the enabled first depth point signal DEPTH1.

When an external command is not input at a rising edge CLK8 of the clock signal CLK, the FIFO controller 310 (of FIG. 3) may generate the decrease signal DEC at a logic level "1" according to a second internal read command INT_RD1 generated from the second external read command RD1 (j). The decrease signal DEC at a logic level "1" may decrease the level of the depth point signals DEPTHi by one so that only the initial depth point signal DEPTH0 is enabled to "0" (k). The second address A1 is still stored in the first register 341 (of FIG. 3) and the first address A0 is still stored in the second register 342 (of FIG. 3). The second address A1 may be transmitted as the column address signal STCAi.

That is, when the latency control circuit 300 (of FIG. 3) receives the first external read command RD0, the latency control circuit 300 (of FIG. 3) may generate the increase signal INC, increase the level of the depth point signal DEPTHi by one to generate the first depth point signal DEPTH1, store the first address A0 input with the first external read command RD0 in the first register 341 (of FIG. 3), and output the first address A0 as the column address signal STCAi. When the second external read command RD1 is applied and the first internal read command INT_RD0 is generated, the latency control circuit 300 (of FIG. 3) may generate the increase signal INC and the decrease signal DEC, maintain the level of the depth point signal to continuously generate the first depth point signal DEPTH1, store the second address A1 input with the second external read command RD1 in the first register 341 (of FIG. 3), output the second address A1 as the column address signal STCAi, and shift the first address A0 to the second register 342 (of FIG. 3). When only the second internal read command is generated, the latency control circuit 300 (of FIG. 3) may generate the decrease signal DEC, reduce the level of the depth point signal DEPTHi by one to generate the initial depth point signal DEPTH0, maintain the values stored in the first and second registers 341 and 342 (of FIG. 3) according to the second external read command EXT_RD1, and maintain the column select signal STCAi.

Figure 2:
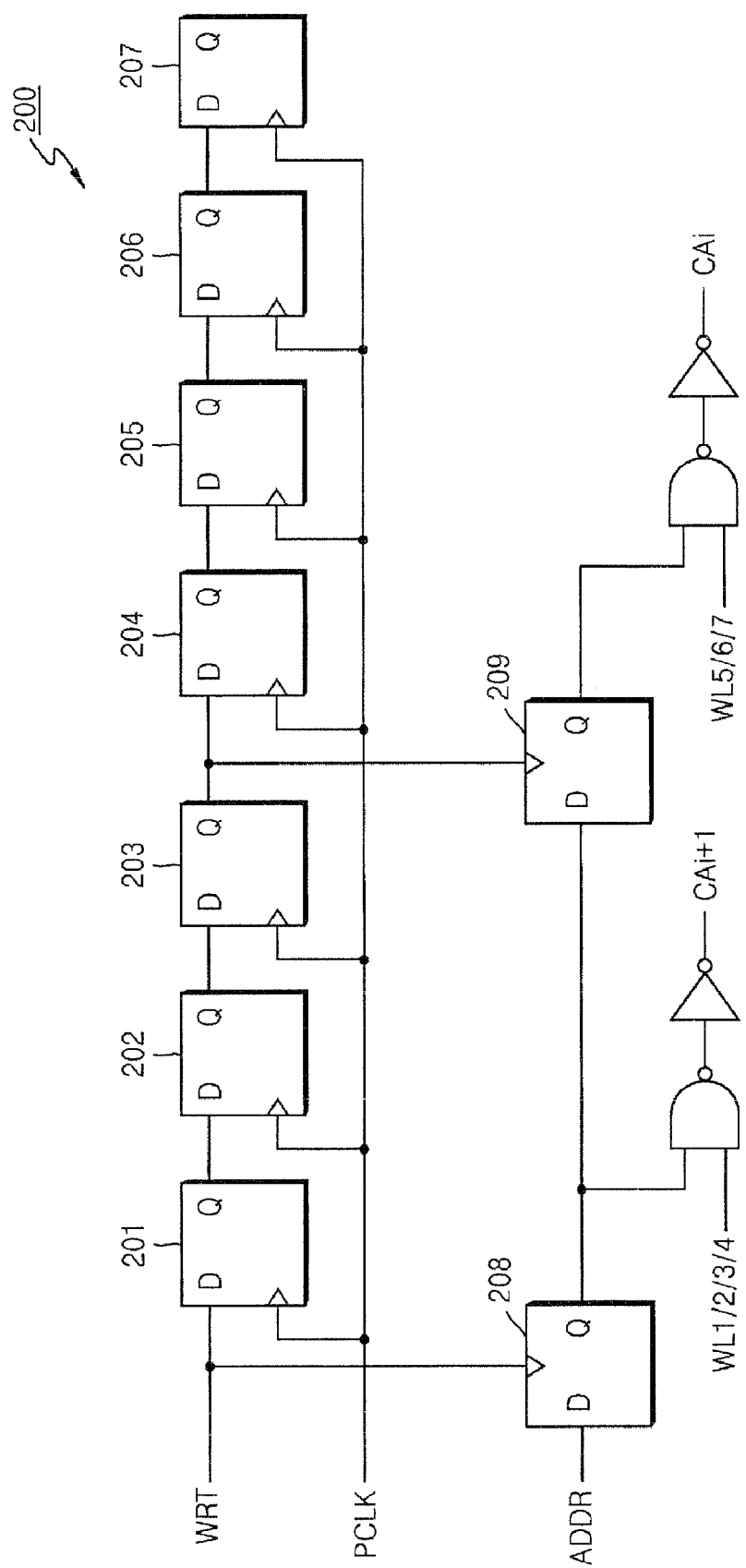
FIG. 2 illustrates another conventional latency control circuit.

That is, the latency control circuit 300 (of FIG. 3) may designate the register storing an address corresponding to the current command using the depth point signals DEPTH1, DEPTH2, and DEPTH3. Accordingly, a surplus register shift operation occurring in the conventional latency control circuit 200 (of FIG. 2), even though the second command is not input to the latency control circuit, does not occur in embodiments of the present invention.

Furthermore, the column address signal STCAi generated in the latency control circuit 300 (of FIG. 3) may be latched responsive to an address latch clock signal ADDR_LCLK (of FIG. 5) when the first address A0 generated at the rising edge CLK1 of the clock signal CLK is used as the column address signal STCAi. This may occur before the increase signal INC is generated according to the second read command RD1 or the decrease signal DEC is generated according to the first internal read command INT_RD0. Accordingly, effective address latch margin is increased.

Moreover, when the number of additive latencies is ten, the number of write latencies is eight, the number of addresses including a column address and a bank address is fifteen, and the number of commands /CS, /RAS, /CAS and /WE is four, the latency control circuit 300 (of FIG. 3) requires (15+4)*3+(15*3)=102 registers. Accordingly, the latency control circuit 300 (of FIG. 3) uses a smaller number of registers compared to the conventional latency control circuit (100 illustrated in FIG. 1) requiring 310 registers. As a result, the area occupied by the registers and power consumption can be reduced.

While the latency control circuit is applied to a semiconductor memory device in the aforementioned embodiment, a person having ordinary skill in the art will recognize that it can also be applied to integrated circuits, such as processors for the purpose of delaying input commands or input addresses.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A latency control circuit comprising:
   a FIFO controller configured to generate an increase signal according to an external command, to generate a decrease signal according to an internal command that is output in response to the external command, and to enable at least one depth point signal responsive to the increase signal and the decrease signal; and
   a register unit configured to store an address in a first register responsive to a clock signal, to shift a previous address to a second register, and to transmit one of the address and the previous address as a column address responsive to the enabled depth point signal.

2. The latency control circuit of claim 1, wherein the FIFO controller comprises a plurality of flip-flops configured to store a plurality of values, each value being determined responsive to the increase signal and the decrease signal.

3. The latency control circuit of claim 2, wherein each of the plurality of values is determined responsive to an exclusive OR operation of the increase signal and the decrease signal.

4. The latency control circuit of claim 1, wherein a level of the depth point signal is increased responsive to the increase signal.

5. The latency control circuit of claim 4, wherein the level of the depth point signal is decreased responsive to the decrease signal.

6. The latency control circuit of claim 5, wherein the FIFO controller is configured to maintain the level of the depth point signal.

7. A latency control circuit comprising:
   a FIFO controller configured to generate an increase signal according to an external command, to generate a decrease signal according to an internal command, and to enable at least one depth point signal responsive to the increase signal and the decrease signal; and
   a register unit configured to store an address in a first register responsive to a clock signal, to shift a previous address to a second register, and to transmit one of the address and the previous address as a column address responsive to the enabled depth point signal,
   wherein a number of registers included in the register unit is determined by dividing a larger value of a maximum number of additive latencies and a maximum number of write latencies by a column cycle delay time (tCCD).

8. A latency control circuit comprising a FIFO controller and a register unit, wherein the register unit comprises:
   n registers;
   n multiplexers configured to select one of an address and a previous address, to store the selected address in a first of n registers, and to shift the address stored in the first register to a neighboring register; and
   an address selection multiplexer configured to select one of the address stored in the first register and the address stored in the neighboring register,
   wherein the neighboring register is any one of the n registers other than the first register, and
   wherein n is determined by dividing a larger value of a maximum number of additive latencies and a maximum number of write latencies by a column cycle delay time (tCCD).

9. The latency control circuit of claim 8, wherein each of the n multiplexers respectively corresponds to one of the n registers.

10. The latency control circuit of claim 9, wherein the n multiplexers are configured to select one of the address and the previous address responsive to an increase signal.

11. The latency control circuit of claim 10, wherein the address selection multiplexer is configured to select one of the address stored in the first register and the address stored in the neighboring register responsive to a depth point signal generated by the FIFO controller.

12. The latency control circuit of claim 8, wherein the FIFO controller comprises:
   (n+1) flip-flops configured to store a plurality of values;
   a first inverter configured to invert an increase signal;
   a second inverter configured to invert a decrease signal;
   (n+1) exclusive OR gates configured to receive the output signals of the first and second inverters; and
   (n+1) multiplexers configured to select an output signal of at least one of the (n+1) flip-flops responsive to the inverted increase and decrease signals.

13. The latency control circuit of claim 12, wherein:
   an output signal of a first flip-flop from among the (n+1) flip-flops is inverted by a third inverter and transmitted as an initial depth point signal, and
   an output of a second flip-flop from among the (n+1) flip-flops is received by a first of n NOR gates together with the output signal of the third inverter.

14. The latency control circuit of claim 13, wherein an output signal of the first NOR gate is inverted by a fourth inverter and transmitted as a first depth point signal.

15. The latency control circuit of claim 14, wherein an output signal of an nth flip-flop is received by an (n−1)th NOR gate.

16. The latency control circuit of claim 15, wherein an output signal of the (n−1)th NOR gate is inverted by a fifth inverter and transmitted as an (n−1)th depth point signal.

17. The latency control circuit of claim 16, wherein an output signal of an (n+1)th flip-flop is received by an nth NOR gate together with the output signal of the (n−1)th NOR gate.

18. The latency control circuit of claim 17, wherein an output signal of the nth NOR gate is inverted by a sixth inverter and transmitted as an nth depth point signal.

19. A latency control method comprising:
   receiving an external command and an address responsive to a clock signal;
   generating an increase signal responsive to the external command;
   storing the address in a register responsive to the increase signal;
   shifting the address to a neighboring register;
   generating a decrease signal responsive to an internal command generated from the external command; and
   selecting at least one of a plurality of depth point signals responsive to the increase signal and decrease signal to designate one of the register and the neighboring register.

20. The method of claim 19, wherein selecting the at least one depth point signal includes maintaining the level of the at least one depth point signal.

21. The method of claim 19, wherein selecting the at least one depth point signal occurs responsive to the increase signal, the decrease signal, and a signal obtained by performing an exclusive OR operation of the increase signal and the decrease signal.

* * * * *